United States Patent
Kato et al.

(10) Patent No.: US 10,804,067 B2
(45) Date of Patent: Oct. 13, 2020

(54) CHARGED PARTICLE BEAM APPARATUS COMPRISING A CONTROLLER TO SET CONTROL PARAMETERS BASED ON MOVEMENT OF THE SAMPLE STAGE

(71) Applicant: Hitachi High-Technologies Corporation, Tokyo (JP)

(72) Inventors: Takanori Kato, Tokyo (JP); Motohiro Takahashi, Tokyo (JP); Naruo Watanabe, Tokyo (JP); Akira Nishioka, Tokyo (JP); Masaki Mizuochi, Tokyo (JP); Shuichi Nakagawa, Tokyo (JP); Hironori Ogawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 102 days.

(21) Appl. No.: 16/240,898

(22) Filed: Jan. 7, 2019

(65) Prior Publication Data
US 2019/0252151 A1  Aug. 15, 2019

(30) Foreign Application Priority Data
Feb. 14, 2018 (JP) .................. 2018-023741

(51) Int. Cl.
| | |
|---|---|
| *H01J 37/244* | (2006.01) |
| *H01J 37/04* | (2006.01) |
| *H01J 37/304* | (2006.01) |
| *H01J 37/30* | (2006.01) |

(52) U.S. Cl.
CPC ............ *H01J 37/04* (2013.01); *H01J 37/244* (2013.01); *H01J 37/3002* (2013.01); *H01J 37/304* (2013.01)

(58) Field of Classification Search
CPC ........ H01J 37/04; H01J 37/244; H01J 37/304; H01J 37/3002; G02B 7/04; G02B 27/40; G02B 27/64
USPC ....... 250/201.1, 201.3, 208.1, 221, 306, 309
See application file for complete search history.

(56) References Cited

U.S. PATENT DOCUMENTS 7,339,147 B2 * 3/2008 Jiang ................. G02B 7/08
250/201.2

FOREIGN PATENT DOCUMENTS

JP  2003-278825 A  10/2003

* cited by examiner

*Primary Examiner* — Que Tan Le
(74) *Attorney, Agent, or Firm* — Mattingly & Malur, PC

(57) ABSTRACT

Provided is a charged particle beam apparatus including: an XY stage on which a sample is placed; a charged particle beam source which irradiates the sample with a charged particle beam; a detector which detects charged particles emitted from the sample upon the irradiation with the charged particle beam; an image generator which generates an SEM image of the sample based on a detection signal output by the detector; and a controller configured to set control parameters based on a movement starting point and a movement ending point of the XY stage and control a driving unit for moving the XY stage according to the control parameters.

13 Claims, 14 Drawing Sheets

REFERENCE IMAGE
(POINT a)

SEM IMAGE IMMEDIATELY
AFTER MOVEMENT
FROM POINT b TO POINT a

CHARGED PARTICLE BEAM APPARATUS COMPRISING A CONTROLLER TO SET CONTROL PARAMETERS BASED ON MOVEMENT OF THE SAMPLE STAGE

CLAIM OF PRIORITY

The present application claims priority from Japanese Patent Application JP 2018-023741 filed on Feb. 14, 2018, the content of which are hereby incorporated by references into this application.

BACKGROUND OF THE INVENTION

1. Field of the Invention

The present invention relates to a charged particle beam apparatus, and particularly, to prevention of image blur of an image acquired from a charged particle beam apparatus.

2. Description of Related Art

A charged particle beam apparatus is an apparatus in which a sample is irradiated with a charged particle beam, such as an electron beam, and the charged particles emitted from the sample are detected, thereby forming an image for observing the sample. If the sample is vibrated due to the influence of the vibration of a floor surface on which the charged particle beam apparatus is set, image blur, which is unsuitable for observation, occurs in the formed image.

JP-A-2003-278825 (PTL 1) discloses an example of a vibration isolator that reduces image blur included in an image. In PTL 1, an actuator disposed below a sample chamber is drive-controlled under drive conditions, which are set based on a result obtained such that the contour part of the pattern of a sample is spot-irradiated with an electron beam to detect contrast data, and contrast vibration data, which is time-associated data thereof, is Fourier transformed. According to PTL 1, since the actuator performs an operation in the opposite phase to remove the vibration, it is possible to reduce the steady-state vibration However, although the influence of the vibration from a floor surface can be reduced in PTL 1, there is no consideration on the vibration generated due to the movement of an XY stage on which the sample is disposed. Particularly, in an inspection and measurement of a semiconductor wafer using a charged particle beam apparatus, the XY stage is moved at high speed to improve the throughput, and thus vibration thereof becomes larger.

SUMMARY OF THE INVENTION

An object of the present invention is to provide a charged particle beam apparatus capable of reducing image blur even when an XY stage is moved at high speed.

In order to achieve the above object, in the present invention, a driving unit is controlled which moves an XY stage based on information on the movement of the XY stage.

More specifically, according to the invention, provided is a charged particle beam apparatus including: an XY stage on which a sample is placed; a charged particle beam source which irradiates the sample with a charged particle beam; a detector which detects charged particles emitted from the sample upon the irradiation with the charged particle beam; an image generator which generates an SEM image of the sample based on a detection signal output by the detector; and a controller configured to set control parameters based on a movement starting point and a movement ending point of the XY stage and control a driving unit for moving the XY stage according to the control parameters.

According to the present invention, it is possible to provide the charged particle beam apparatus capable of reducing image blur even when the XY stage is moved at high speed.

DESCRIPTION OF EMBODIMENTS

First Embodiment

Hereinafter, the present embodiment will be described with reference to the drawings.

Figure 1:
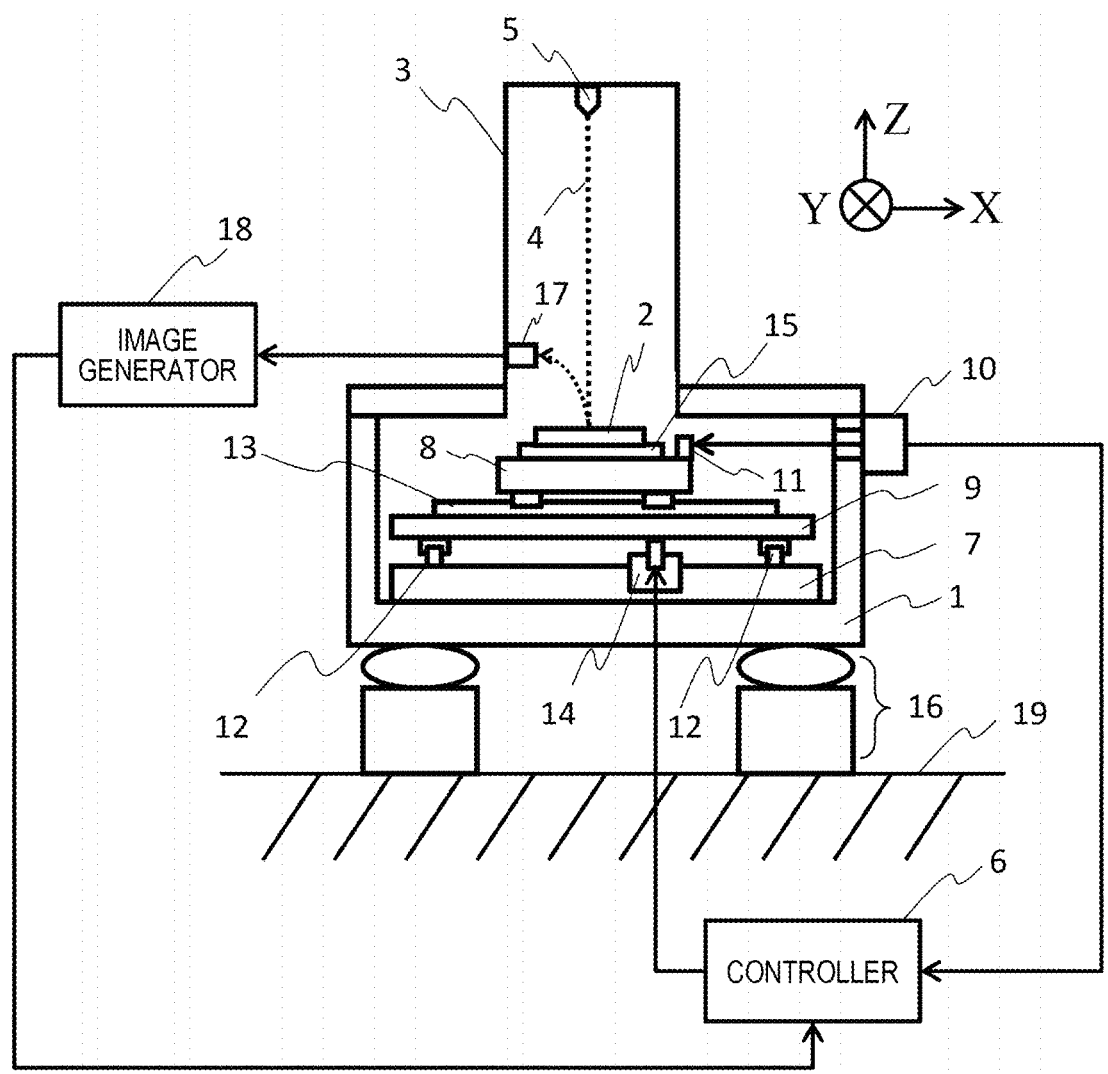
FIG. 1 is an overall perspective view illustrating a charged particle beam apparatus according to the present invention.

FIG. 1 is an overall perspective view of a charged particle beam apparatus. In FIG. 1, on a base 7 fixed inside a sample chamber 1, a Y table 9, which is freely movable in a Y direction (the page depth-wise direction) through two Y linear guides 12, is arranged and a Y linear motor 14 is arranged so as to generate relative thrust in the Y direction. On the Y table 9, an X table 8, which is freely movable in an X direction through two X linear guides 13, is arranged and an X linear motor (not illustrated) is arranged so as to generate thrust in the X direction. As a result, the X table 8 can move in the X and Y directions with respect to the base 7 and the sample chamber 1.

A wafer 2 as a sample to be observed is placed on the X table 8. In order to place the wafer 2, a wafer holding mechanism 15 is used which has mechanical holding force or holding force such as electrostatic force, or the like.

Furthermore, at the X table 8 and the Y table 9, a laser interferometer 10 and a mirror 11 for measuring the positions of the tables are installed. The laser interferometer 10 irradiates the mirror 11 with a laser beam to measure the relative displacement amounts between the sample chamber 1 and the X table 8 or the Y table 9 using the reflected light of the laser beam. By feeding back the measured relative displacement amounts to a controller 6, a servo control system for the X direction and the Y direction is formed. Accordingly, the X table 8 is positioned at a desired point in the X and Y directions, thereby performing an inspection and measurement on the entire surface of the wafer 2. Here, the X table 8 and the Y table 9 will be collectively called as an XY stage.

To remove vibration transmitted from a floor 19 to the sample chamber 1, a total of four anti-vibration mounts 16 are arranged on the bottom surface of the sample chamber 1, such that two of the anti-vibration mounts 16 are arranged for each of the X-axis and the Y-axis as a passive anti-vibration device.

In the sample chamber 1, a column 3 for holding an electron optical system is disposed. The column 3 includes an electron gun 5 which irradiates the wafer 2 with an electron beam 4. As the wafer 2 is irradiated with the electron beam 4, secondary electrons or reflected electrons emitted from the wafer 2 are detected by a detector 17 to be output as a detection signal. The detection signal output from the detector 17 is converted into an SEM image at an image generator 18. The edge of a sample pattern is extracted from the SEM image, a vibration waveform derived from the change over time of the edge is input to the controller 6 to be used to drive-control the Y linear motor 14 and the X linear motor that drive the XY stage. Details of the drive-control will be described below with reference to FIGS. 3 to 6A and 6B.

As a guide mechanism for the XY stage according to the present embodiment, air bearings, ball screws, and the like may be used in addition to the above-mentioned linear guides. Also, as a driving unit for the XY stage, in addition to the linear motor, magnetic levitation, a planar motor, a piezoelectric motor, a pulse motor, and the like may be used. Further, in addition to the laser interferometer 10 described above, other position detection units, such as a linear scale, may be used to detect the position of the XY stage.

Figure 2A:
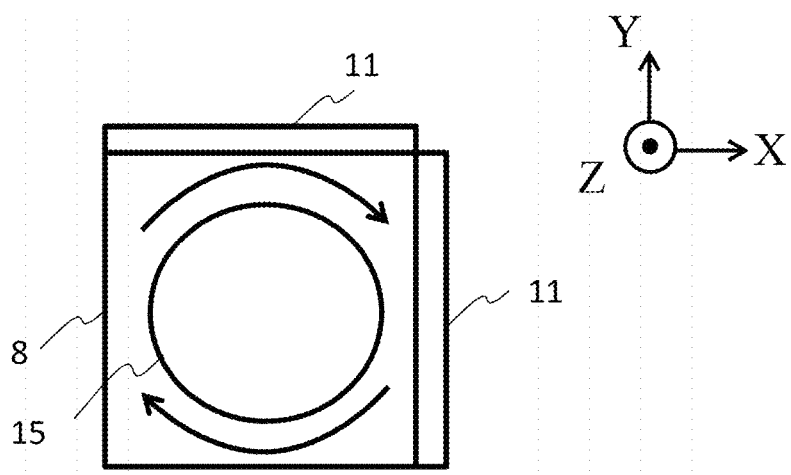
FIGS. 2A and 2B are diagrams for describing vibration of a wafer holding mechanism.
Figure 2B:
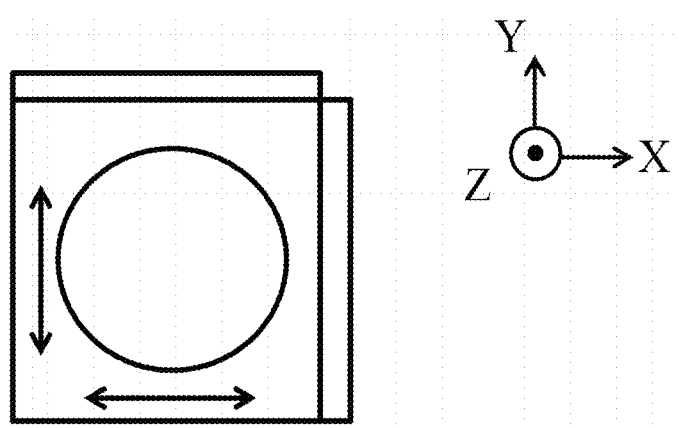

Vibrations of the wafer holding mechanism 15 will be described with reference to FIGS. 2A and 2B. Vibrations in the rotational direction as illustrated in FIG. 2A or vibrations in the X and Y directions as illustrated in FIG. 2B occurs in the wafer holding mechanism 15 as the XY stage moves. The amplitude, direction, and attenuation rate of the vibration of the wafer holding mechanism 15 vary depending on the coordinates of the XY stage. Although the vibration of the XY stage can be detected by the laser interferometer 10 and the mirror 11, the vibration of the wafer holding mechanism 15 cannot be detected. In addition, the vibration of the wafer holding mechanism 15 is on the order from several nanometers to several tens of nanometers, and thus it is difficult to install a vibration detector in the wafer holding mechanism 15 in terms of resolution of the vibration detector, routing of the wiring, and electric noises. Therefore, it is preferable to move the XY stage so as to suppress the vibration of the wafer holding mechanism 15.

Figure 3:
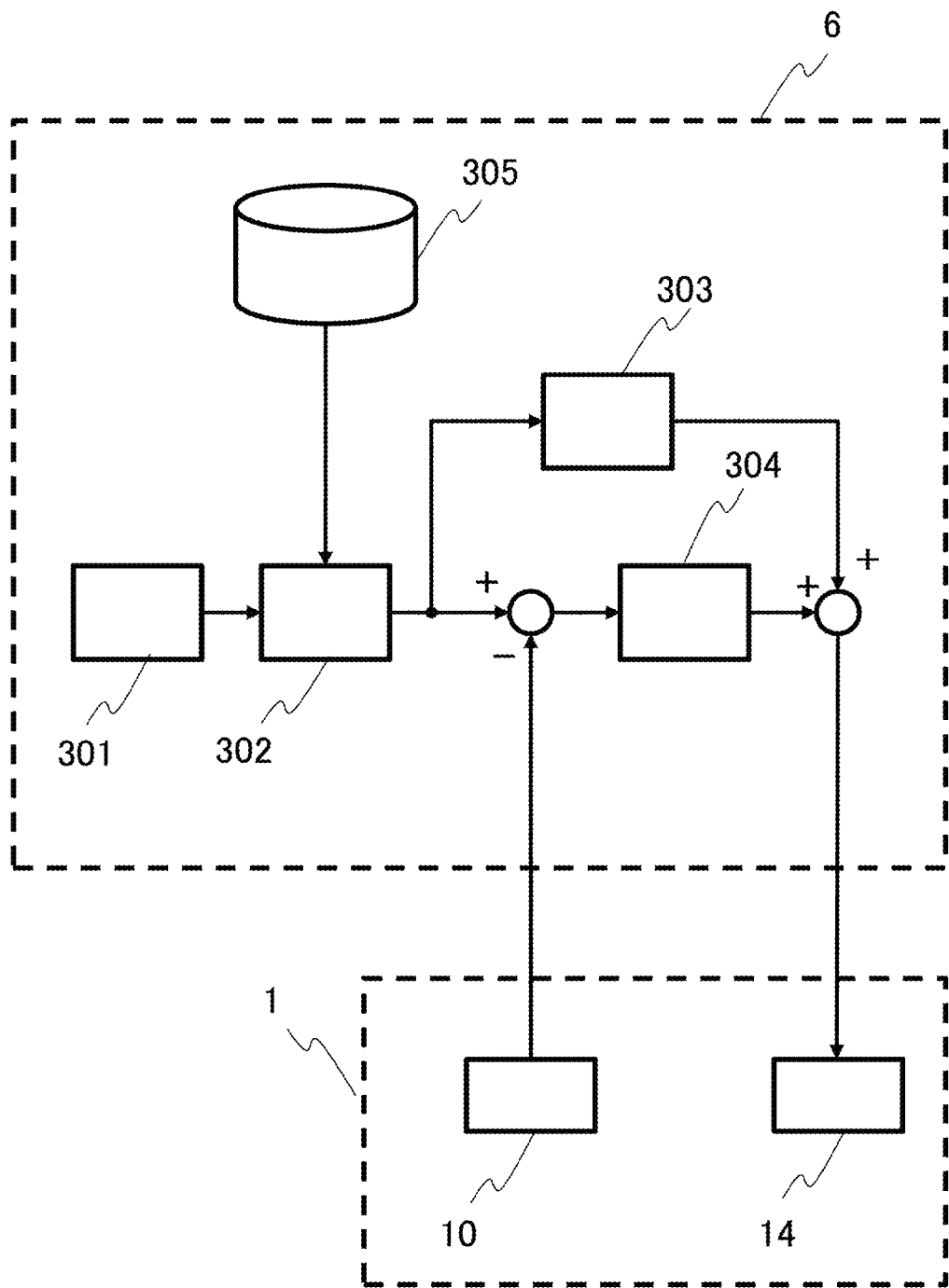
FIG. 3 is a block diagram illustrating a controller in detail.

FIG. 3 is a block diagram illustrating the controller in detail. The controller 6 includes an instruction generator 301, a filter processor 302, a feed forward controller 303, a feedback controller 304, and a storage unit 305. Hereinafter, each of the components will be described.

The instruction generator 301 generates instructions, such as a movement starting point and a movement ending point, speed, acceleration, and the like. Based on an instruction generated by the instruction generator 301, the filter processor 302 performs filtering processing to exclude specific vibration frequency components by using a notch filter as illustrated in Equation 1 or the like, for example.

$$F(s)=(s^2+\omega^2)/(s^2+Q\omega s+\omega^2) \quad \text{[Equation 1]}$$

Here, "s" denotes the Laplace operator, "ω" denotes an angular frequency of the vibration frequency component to be excluded, and "Q" denotes the sharpness of the vibration frequency component to be excluded.

Figure 4:
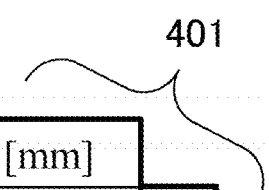
FIG. 4 is a diagram for describing a parameter map.

Control parameters ω and Q are set based on the XY coordinates of the movement starting point and the movement ending point and a parameter map 401 illustrated in FIG. 4, for example. The parameter map 401 is stored in the storage unit 305 and stores control parameters f ($=\omega/2\pi$) and Q in a matrix form for each pair of a start coordinate, which is an XY coordinate of a movement starting point, and an end coordinate, which is an XY coordinate of a movement ending point. The calculation of control parameters to be stored will be described below with reference to FIG. 7, or the like.

When the XY coordinates of the movement starting point and the movement ending point of the XY stage are given, the filter processor 302 reads out control parameters from the parameter map 401 and performs filtering processing by applying the control parameters to [Equation 1]. The parameter map 401 may be created for each Z coordinate to be stored in the storage unit 305. By storing the parameter map 401 for each Z coordinate, it is possible to cope with the vibration of the XY stage which occurs when a working distance is changed. In addition, the parameter map 401 may be created for each tilt angle of the XY stage. Furthermore, by performing linear interpolation, spline interpolation, or the like between the XYZ coordinates and the tilt angles stored in the parameter map 401, the number of XY coordinates to be stored and the number of the parameter maps 401 can be reduced. If there are a plurality of vibration frequency components to be excluded, each vibration frequency component can be reduced by filtering with a cascade calculation.

The feed forward controller 303 generates a control input for improving the responsiveness of the XY stage. The feedback controller 304 generates a control input so as to reduce an error between the position of the XY stage detected by the laser interferometer 10 serving as the position detector, and an instruction.

Based on a result of adding control inputs generated by the feed forward controller 303 and the feedback controller 304, the Y linear motor 14 and the X linear motor are driven which serve as the driving units of the XY stage.

Figure 5:
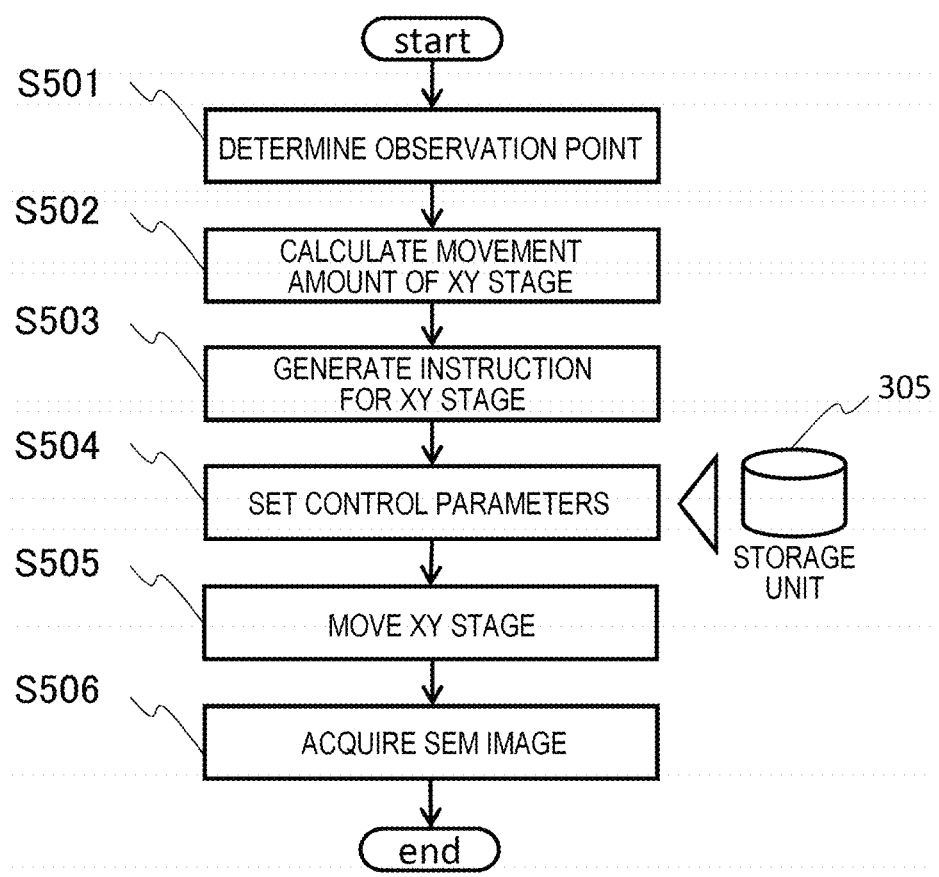
FIG. 5 is a diagram illustrating a flow of a process of controlling a driving unit of an XY stage.

The flow of a process of controlling the driving units of the XY stage will be described with reference to FIG. 5.

In step S501, the coordinate of an observation point is determined.

In step S502, a movement amount of the XY stage is calculated from a current coordinate of the XY stage and the coordinate of the observation point.

In step S503, an instruction to move the XY stage from the current coordinate, which is the coordinate of the movement starting point, to the coordinate of the observation point, which is the coordinate of the movement ending point, is generated.

In step S504, control parameters are read out from the parameter map 401 stored in the storage unit 305 of the controller 6 based on the current coordinate and the coordinate of the observation point, interpolation is performed as necessary, and the control parameters are set.

In step S505, the XY stage is moved in accordance with the instruction generated in step S503. When moving the XY stage, filtering processing, a feed forward control, a feedback control, and the like are performed so as not to excite the vibration.

In step S506, an SEM image is acquired at the coordinate of the observation point.

According to the flow of the process described above, the XY stage can be driven with a drive signal from which a specific vibration frequency component, for example, the mechanism vibration frequency component of the XY stage is excluded. In the controller 6, the configuration and the method of excluding specific vibration frequency components may not be limited to filtering processing, and other methods may be applied such as planning trajectory of the XY stage and shaping frequency of a movement instruction.

Figure 6A:
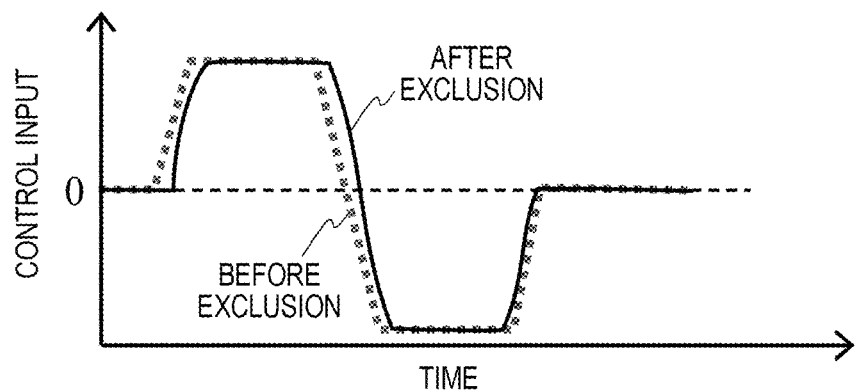
FIGS. 6A and 6B are diagrams illustrating an example of a control input and amplitude after a specific vibration frequency component is excluded.
Figure 6B:
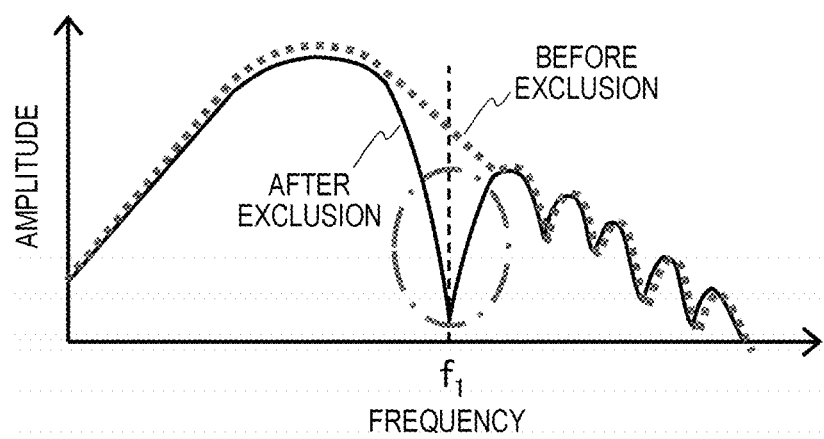

Referring to FIGS. 6A and 6B, an example of a control input and amplitude after excluding a specific vibration frequency component according to the embodiment will be described through a comparison with the control input and amplitude before exclusion. FIG. 6A illustrates a waveform of a control input for driving the driving unit of the XY stage, and FIG. 6B illustrates a waveform after Fourier transformation of the control input. Before exclusion of a specific vibration frequency component, the XY stage is driven according to a control input including a lot of components of a mechanism frequency $f_1$ of the XY stage, and thus image blur occurs. After excluding the frequency component of the mechanism vibration, the component of the mechanism frequency $f_1$ is reduced, and thus it is possible to prevent image blur caused by the mechanism vibration even immediately after moving the XY stage.

An example of a flow of a process of creating the parameter map 401 will be described with reference to FIG. 7.

In step S701, the XY stage is moved from any movement starting point on the wafer 2 to a movement ending point.

In step S702, the wafer 2 as a sample is irradiated with the electron beam 4, and thus an SEM image immediately after the movement is acquired.

In step S703, the edge of the sample pattern of the SEM image acquired in step S702 is extracted, and the vibration waveform is derived from the change over time of the edge.

Figure 8:
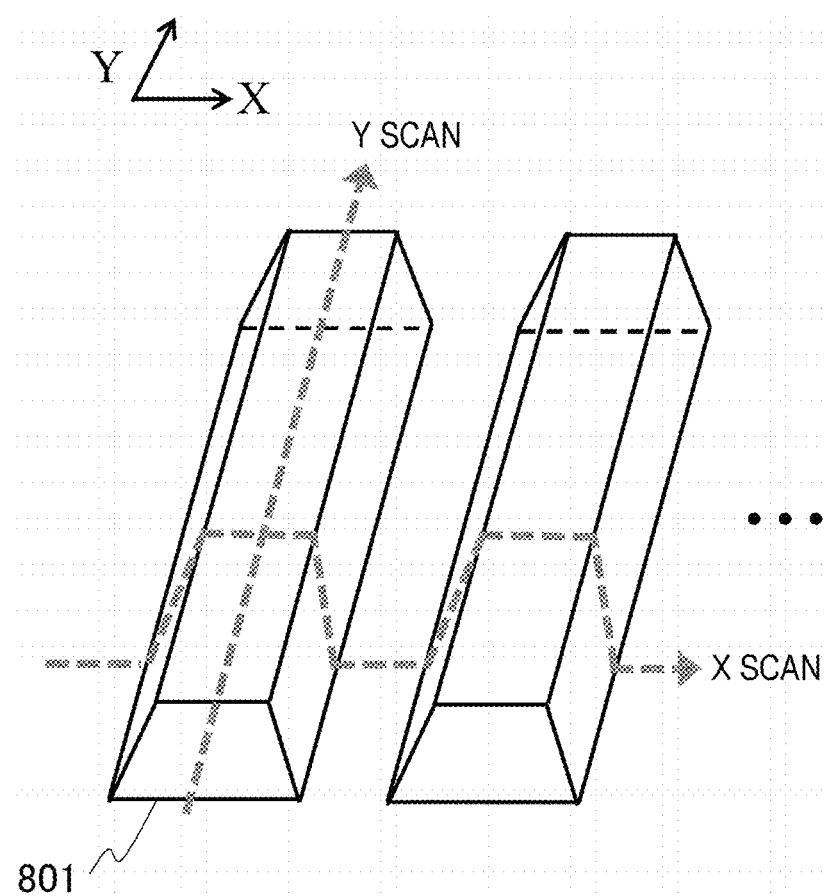
FIG. 8 is a schematic view illustrating a scan direction of a sample.

FIG. 8 is a schematic view illustrating a scan direction of a sample. By scanning a sample pattern 801 in the X and Y directions, a 2-dimensional SEM image is created. As the sample pattern 801, for example, a line pattern or the like is used. Roughness of the sample pattern 801, such as scattering, a defect, or the like adversely affects the result of a frequency analysis of an SEM image. Therefore, by making the scanning gain of the Y scan to zero and reciprocally scanning the same position in the X-axis direction, it is possible to reduce the influence of the roughness of the sample pattern 801 and to improve the detection accuracy of the frequency of the mechanism vibration in the X-axis direction. Also, by rotating the scan direction by 90 degrees, the influence of the roughness of the sample pattern 801 in the Y-axis direction can be reduced, thereby improving the detection accuracy of the frequency of the mechanism vibration in the Y-axis direction. Since the upper limit of detectable frequencies vary depending on a scan speed, it is desirable to select the scan speed according to a frequency to be detected.

In step S704, a frequency analysis is performed by Fourier transformation or the like on the vibration waveform obtained in step S703.

In step S705, based on the result of the frequency analysis in step S704, vibration frequencies to be excluded are specified.

In step S706, control parameters are calculated to exclude the vibration frequencies specified in step S705 from a drive signal of the XY stage. The calculated control parameters are stored in the parameter map 401 in the storage unit 305 in association with the movement starting point and the movement ending point. The flow of the process from step S701 to step S706 is repeated until the parameter map 401 is sufficiently filled, and thus the parameter map 401 is created.

Figure 7:
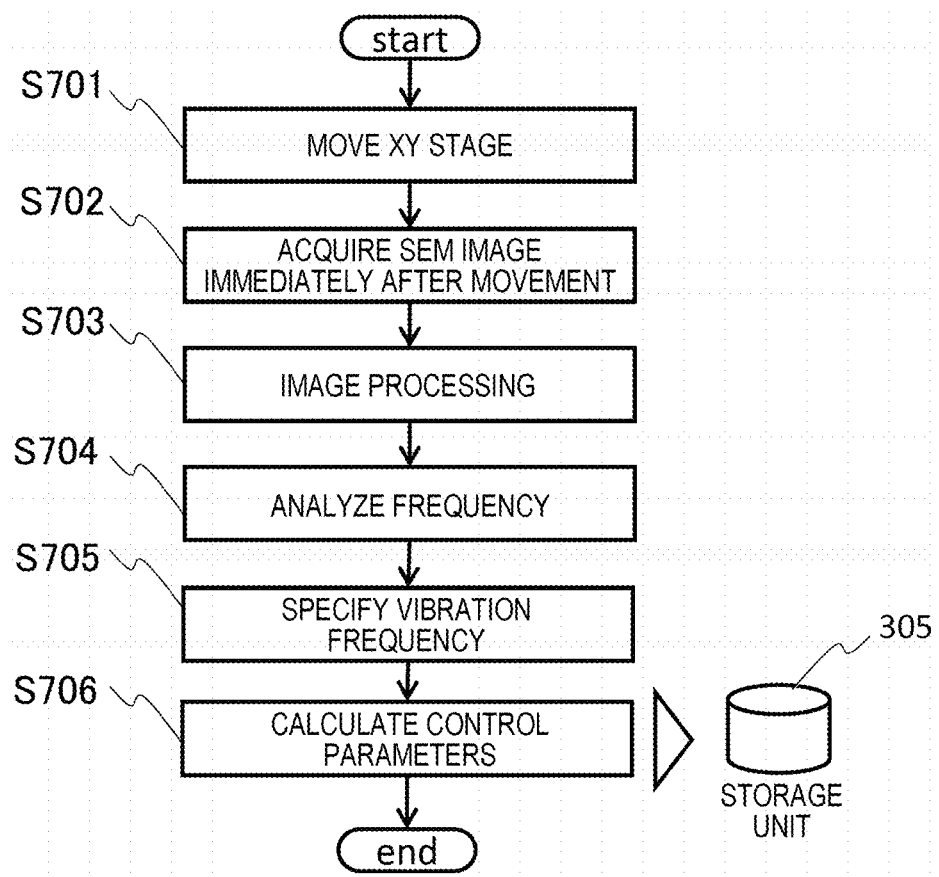
FIG. 7 is a diagram illustrating an example of a flow of a process of creating the parameter map.

Since the flow of the process illustrated in FIG. 7 can be implemented only with the acquisition of the SEM image immediately after the movement, the flow may be executed at any timing, such as when a product is shipped or each time when the XY stage is moved. In addition, the control parameters may be calculated from an average value of results of a plurality times of frequency analyses. In this case, when a sudden disturbance occurs in the charged particle beam apparatus and inappropriate data, in which the amplitude of swing is abnormally large, is included the frequency analysis, an average value thereof may be obtained without including the corresponding data or the data acquisition may be executed again. Alternatively, the results of a plurality times of frequency analyses may be sequentially stored, and control parameters may be calculated with respect to the stored data using a learning rule, such as machine learning.

Figure 9:
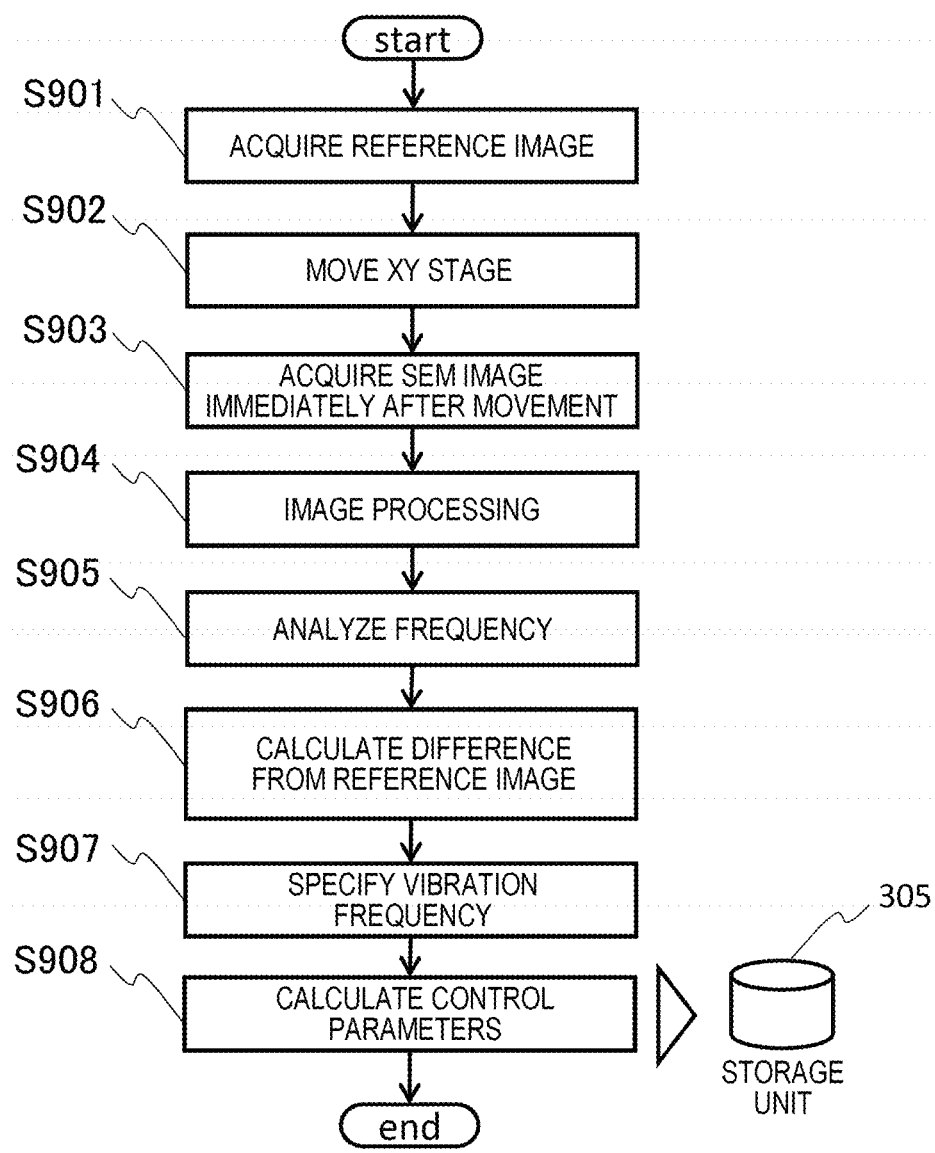
FIG. 9 is a diagram for describing another example of a flow of a process of creating the parameter map.

Another example of a flow of a process of creating the parameter map 401 will be described with reference to FIG. 9. In this example, an SEM image acquired when the XY stage is in a steady state is acquired as a reference image in addition to an SEM image immediately after a movement to create the parameter map 401 using both the SEM images.

In step S901, an SEM image is acquired when the XY stage is in a steady state at an arbitrary observation point as the reference image.

In step S902, the XY stage is moved from an arbitrary movement starting point to the observation point where the SEM image was acquired in step S901.

Figure 10:
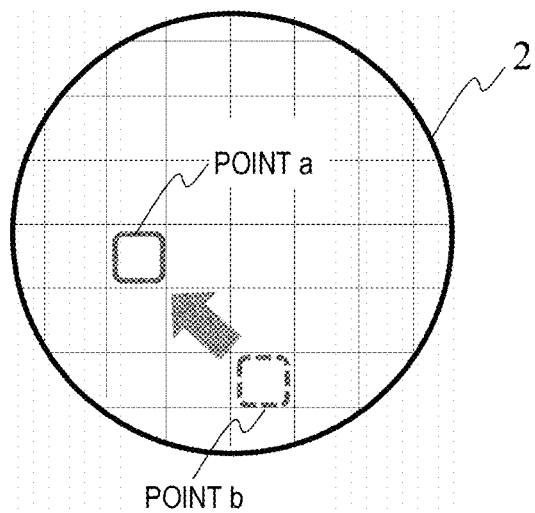
FIG. 10 is a diagram illustrating an example of a reference image and an SEM image immediately after the movement of the XY stage.
Figure 10:
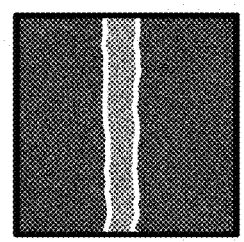
Figure 10:
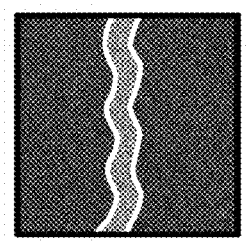

In step S903, an SEM image immediately after the movement of the XY stage is acquired. FIG. 10 illustrates an example of the reference image and the SEM image immediately after the movement. The reference image is an SEM image acquired at a point a and the SEM image immediately after the movement is an SEM image acquired immediately after the XY stage is moved from a point b to the point a, where both of the SEM images cover the periphery of the edges of the sample pattern. Since the reference image is the SEM image acquired when the XY stage is in the steady state, there is no image blur at the edges thereof. However, the SEM image immediately after the movement includes image blur at the edges. Also, by acquiring the reference image and the SEM image immediately after the movement at the same coordinates, it is possible to eliminate the influence due to the difference in sample patterns.

In step S904, the edges of the sample patterns of the respective SEM images acquired in steps S901 and S903 are extracted, and a vibration waveform is derived from each of the SEM images.

In step S905, frequency analyses are performed through Fourier transformation or the like on both of the vibration waveforms obtained in step S904.

Figure 11:
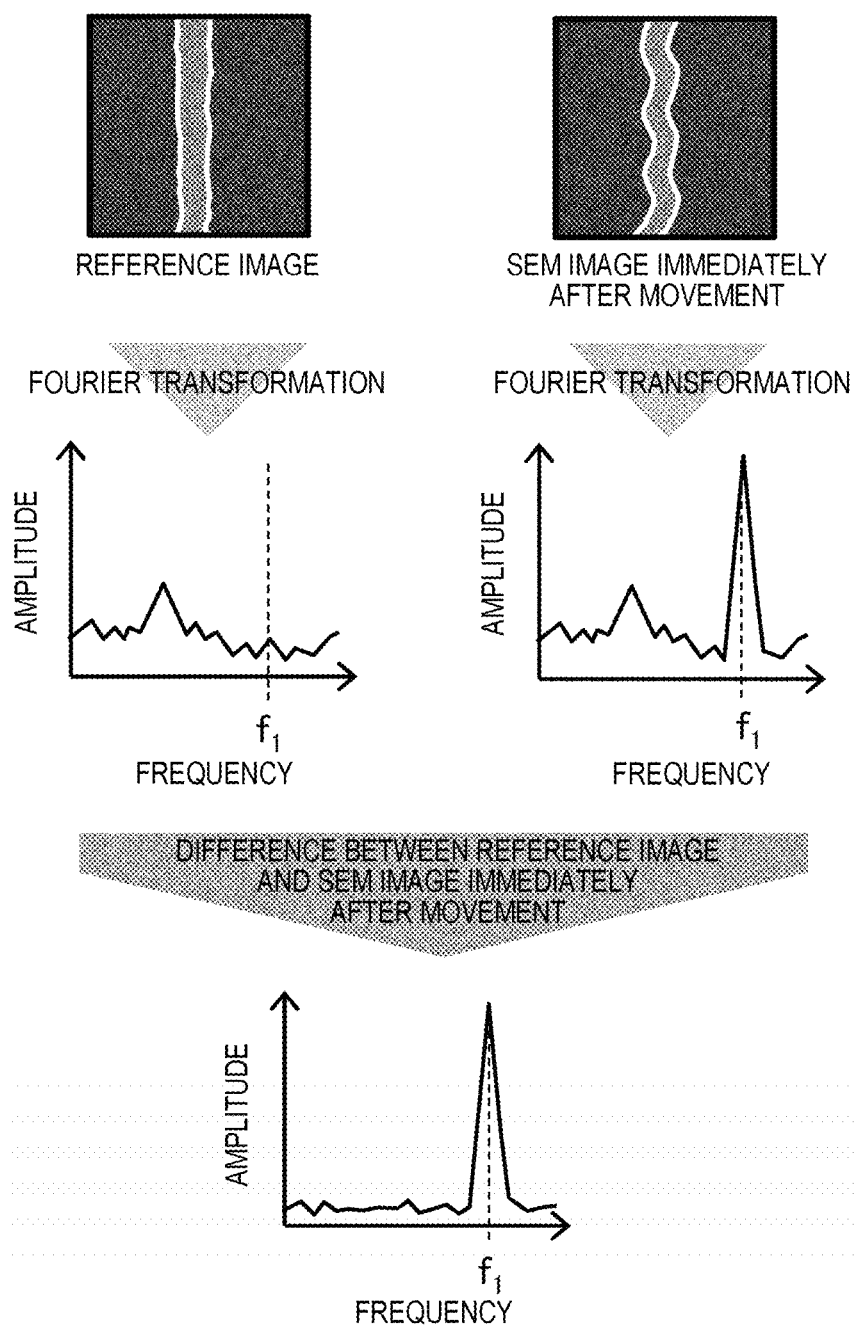
FIG. 11 is a diagram illustrating the concept of a frequency analysis and a difference calculation of the SEM image.

In step S906, the difference between the reference image, which is the SEM image when the XY stage is in the steady state, and the SEM image immediately after the movement of the XY stage is calculated using the results of frequency analyses of the SEM images. FIG. 11 illustrates a conceptual diagram during the process in steps S905 and S906. The upper portion of FIG. 11 illustrates an example of a reference image and an SEM image immediately after a movement, the middle portion of FIG. 11 illustrates an example of a result of a frequency analysis using the Fourier transformation, and the lower portion of FIG. 11 illustrates a result of a difference calculation, respectively. When the frequency of the mechanism vibration of the XY stage is denoted by $f_2$, the SEM image immediately after the movement exhibits an amplitude peak at the frequency $f_2$. On the other hand, the reference image includes only frequency components related to vibrations caused by floor vibrations, noises, sound waves, and the like. Therefore, by only calculating a difference between the frequency components of the SEM image immediately after the movement and the reference image as shown in Equation 2, only the frequency of the mechanism vibration $f_1$ of the XY stage can be detected.

$$y_d(f_i) = y_s(f_i) - y_0(f_i) (i=1,2, \ldots m) \quad \text{[Equation 2]}$$

Here, "$y_d$" denotes a result of the calculation of a difference, "$y_s$" denotes a result of a frequency analysis of the SEM image immediately after the movement, "$y_0$" denotes a result of a frequency analysis of the reference image, and "$f_i$" denotes an arbitrary frequency.

In step S907, based on the difference calculated in step S906, vibration frequencies to be excluded are specified. Also, when there are a plurality of amplitude peaks in the result of calculation of a difference, the frequencies of all of the peaks may be specified as vibration frequencies to be excluded, or frequencies having amplitudes equal to or greater than a predetermined threshold value may be specified as vibration frequencies to be excluded. In addition, a frequency at which the amplitude attenuation coefficient of each frequency component is equal to or greater than a predetermined threshold value may be specified as a vibration frequency to be excluded. The attenuation coefficient is obtained based on a plurality of SEM images acquired at different time points after the movement of the XY stage.

Figure 12:
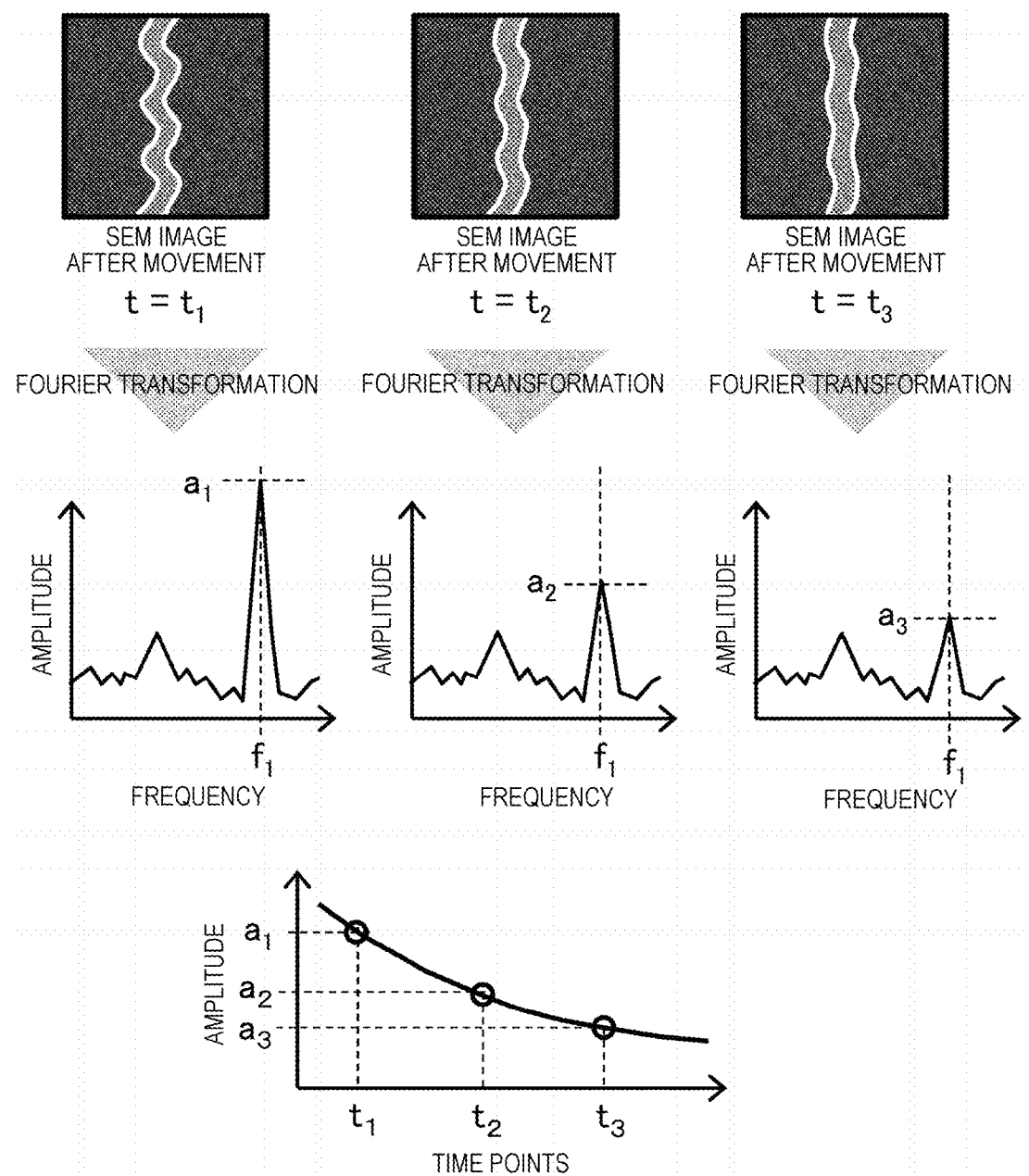
FIG. 12 is a diagram for describing a method of obtaining attenuation coefficients of the amplitude of each frequency component.

How to obtain the attenuation coefficient of the amplitude of each frequency component will be described below with reference to FIG. 12. The upper portion of FIG. 12 illustrates examples of a plurality of SEM images acquired at different time points $t_1$, $t_2$, and $t_3$ after the movement of the XY stage, the middle portion thereof illustrates examples of results of respective frequency analyses using Fourier transformation on the plurality of SEM images, and the lower portion thereof illustrates an example of change over time of the amplitude of a certain frequency component, respectively. Since the amplitude is attenuated exponentially as the time elapses, the change over time of the amplitude can be expressed as Equation 3.

$$A(t) = A_0 \exp(-t/\xi) \quad \text{[Equation 3]}$$

Here, "$A(t)$" is the amplitude at the time point t, "$A_0$" denotes a constant, and "$\xi$" denotes an attenuation coefficient.

By approximating Equation 3 by the least-square method using the set of numerical values of $A(t_1)=a_1$, $A(t_2)=a_2$, and $A(t_3)=a_3$ illustrated in the lower portion of FIG. 12, the attenuation coefficient $\xi$ can be obtained with the constant $A_0$. If the time from the time point $t_1$ to the time point $t_2$ and the time from the time point $t_2$ to the time point $t_3$ are the period of vibration, the attenuation coefficient $\xi$ can be obtained by Equation 4.

$$\xi = \frac{1}{2} \times \ln(a_1/a_3)/(2\times\pi) \quad \text{[Equation 4]}$$

In step S908, control parameters for excluding the specified vibration frequency from a drive signal for the XY stage are calculated. The calculated control parameters are stored in the parameter map 401 in the storage unit 305 in association with the movement starting point and the movement ending point. The flow of the process from step S901 to step S908 is repeated until the parameter map 401 is sufficiently filled, and thus the parameter map 401 is created.

Figure 13:
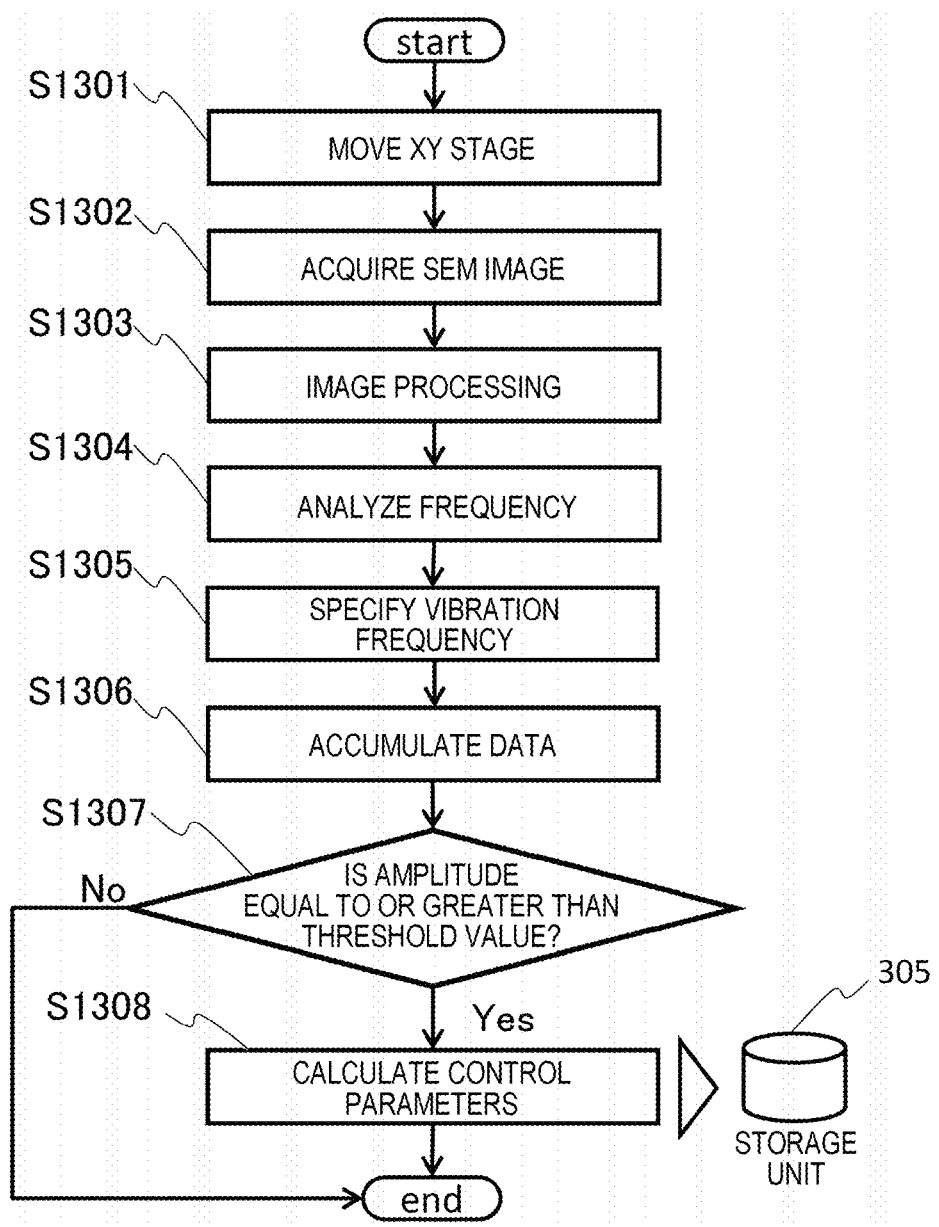
FIG. 13 is a diagram illustrating an example of a flow of a process of updating the parameter map.

When the frequency of the mechanism vibration of the XY stage changes due to the wear of the guiding mechanism of the XY stage, the change over time of the driving unit, or the like, it is desirable to update the parameter map 401. Therefore, an example of the flow of a process of updating the parameter map 401 will be described with reference to FIG. 13.

In step S1301, the XY stage is moved from any movement starting point on the wafer 2 to a movement ending point.

In step S1302, the wafer 2 as a sample is irradiated with the electron beam 4, and thus an SEM image immediately after the movement is acquired.

In step S1303, the edge of the sample pattern of the SEM image acquired in step S1302 is extracted, and the vibration waveform is derived from the change over time of the edge.

In step S1304, a frequency analysis is performed by Fourier transformation or the like on the vibration waveform obtained in step S1303.

In step S1305, based on the result of the frequency analysis in step S1304, a vibration frequency to be excluded are specified.

In step S1306, the vibration frequency specified in step S1305 and the amplitude at the corresponding vibration frequency are accumulated in a memory or the like.

In step S1307, the amplitude at the vibration frequency specified in step S1305 is compared with a predetermined threshold value, and it is determined whether to update the control parameters based on the comparison result. In other words, if the amplitude is equal to or greater than the threshold value, the process proceeds to step S1308 in order to update the control parameters. If the amplitude is less than the threshold value, the process is terminated. It is preferable to set the threshold value based on the specification of the charged particle beam apparatus, environmental disturbances, or the like.

In step S1308, control parameters for excluding the vibration frequency specified in step S1305 from a drive signal of the XY stage are calculated and updated. The updated control parameters are stored in the parameter map 401 in the storage unit 305 in association with the movement starting point and the movement ending point. Here, the control parameters may be updated using all or some of the data accumulated in step S1306.

Figure 14:
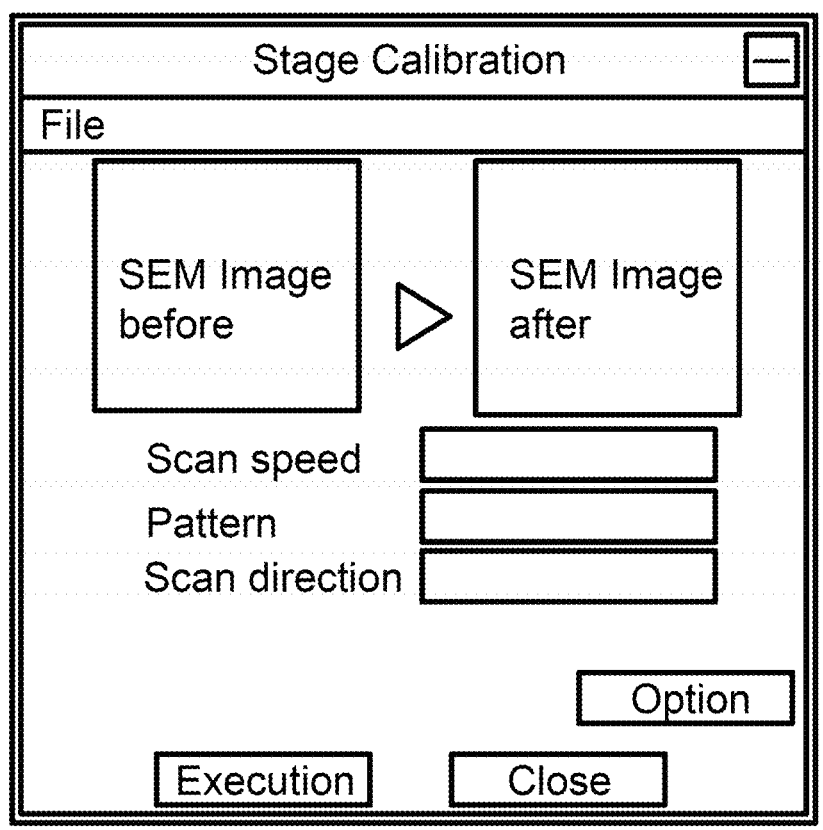
FIG. 14 is a diagram illustrating an example of a screen for executing calibration.

In order to visually show the effect of the update of the control parameters, a screen for executing calibration may be displayed. FIG. 14 is a diagram illustrating an example of a screen for executing calibration. On the execution screen, SEM images before and after the calibration or the results of frequency analyses on the corresponding SEM images are displayed to visually show the effect of the calibration. As the setting of the calibration, a scan speed, a sample pattern, a scan direction, and other options may be selected. After a user sets respective conditions, the flow of the process may be executed as illustrated in FIG. 7, FIG. 9, or the like, and the result therefrom may be output on the execution screen. The user can select whether to update the control parameters based on the output result.

When the installation environment of the charged particle beam apparatus is changed, the steady-state vibration, such as floor vibration, may also be changed. In this case, control parameters may be updated using the reference image as in the flow of the process illustrated in FIG. 9. Furthermore, in order to allow a user to arbitrarily determine the update timing of control parameters, when the amplitude exceeds the threshold value, it may be displayed on a maintenance GUI as an error message to notify the user.

According to the charged particle beam apparatus configured as described above, since the XY stage is drive-controlled so as to exclude vibration frequency components specified using an SEM image including image blur, it is possible to obtain a high-definition SEM image without image blur caused by the mechanic vibration even at high throughputs. In addition, since the frequency of the mechanism vibration is specified by utilizing SEM images each of which can be acquired at from several tens ms to several hundred ms, calibration and maintenance can be performed within a short period of time.

Although the vibrations of the wafer holding mechanism 15 has been described in the embodiment, the present invention can also be applied to the case of vibrations appearing in an SEM image, for example, vibrations at the XY stage or at the column. Further, when the vibrations of the XY stage is measured by the laser interferometer 10 and the deflection correction on an electron beam is performed using the measurement result, the filtering processing of the embodiment may be applied to the measurement result of the laser interferometer 10.

Here, these general or specific aspects may be implemented with an apparatus, a system, an integrated circuit, a computer program, or a recording medium such as a computer-readable CD-ROM, or may be implemented with an arbitrary combination of the apparatus, the system, the integrated circuit, the computer program, and the recording medium.

For example, all or some of the image generator 18, the instruction generator 301, the filter processor 302, the feed forward controller 303, the feedback controller 304, the storage unit 305, and the like may be formed in hardware. In addition, all or some of the components constituting the generator, the processor, the controller, and the storage unit may be program modules executed by a Central Processing Unit(CPU) or the like.

Further, all or some of the image generator 18, the instruction generator 301, the filter processor 302, the feed forward controller 303, the feedback controller 304, the storage unit 305, and the like may be configured with a computer system including a microprocessor, a Read Only Memory (ROM), a Random Access Memory (RAM), and the like.

It should be noted that the charged particle beam apparatus according to the present invention is not limited to the above-described embodiments, but can be embodied by modifying components thereof without departing from the spirit of the invention. In addition, a plurality of components disclosed in the above embodiment may be appropriately combined. Furthermore, some components may be removed from all the components illustrated in the above embodiment.

What is claimed is:
1. A charged particle beam apparatus comprising:
an XY stage on which a sample is placed;
a charged particle beam source which irradiates the sample with a charged particle beam;
a detector which detects charged particles emitted from the sample upon the irradiation with the charged particle beam;
an image generator which generates an SEM image of the sample based on a detection signal output by the detector; and
a controller configured to set control parameters based on a movement starting point and a movement ending point of the XY stage and control a driving unit for moving the XY stage according to the control parameters.

2. The charged particle beam apparatus according to claim 1, wherein
the controller includes a storage unit which stores a parameter map in which the control parameters are stored for each combination of a movement starting point and a movement ending point, and
the control parameters are set based on the given movement starting point and movement ending point and the parameter map.

3. The charged particle beam apparatus according to claim 2, wherein
the parameter map is created based on a result of a frequency analysis on an SEM image acquired after moving the XY stage.

4. The charged particle beam apparatus according to claim 2, wherein
the parameter map is created based on a result of frequency analyses on a reference image, which is an SEM image when the XY stage is in a steady state, and on an SEM image acquired after moving the XY stage.

5. The charged particle beam apparatus according to claim 2, wherein
the parameter map is updated when amplitude of vibrations included in the SEM image becomes equal to or greater than a predetermined threshold value due to a change of a guiding mechanism or the driving unit of the XY stage.

6. The charged particle beam apparatus according to claim 5, wherein
SEM images before and after the update of the parameter map are displayed.

7. The charged particle beam apparatus according to claim 2, wherein
the parameter map is created for each Z coordinate of the XY stage.

8. The charged particle beam apparatus according to claim 2, wherein
the parameter map is created for each tilt angle of the XY stage.

9. The charged particle beam apparatus according to claim 1, wherein
the controller includes a filter processor performing filtering processing to exclude specific vibration frequency components.

10. The charged particle beam apparatus according to claim 9, wherein
the filter processor performs the filtering processing with a notch filter.

11. The charged particle beam apparatus according to claim 9, wherein
the vibration frequency component excluded by the filter processor is specified based on a result of a frequency analysis on an SEM image acquired after moving the XY stage.

12. The charged particle beam apparatus according to claim 11, wherein
the vibration frequency component excluded by the filter processor is a frequency having amplitude equal to or greater than a predetermined threshold value in the result of the frequency analysis.

13. The charged particle beam apparatus according to claim 11, wherein
the vibration frequency component excluded by the filter processor is a frequency at which an attenuation coefficient of amplitude obtained based on a result of a frequency analysis on each SEM image acquired at different time points after moving the XY stage is equal to or greater than a predetermined threshold value.

* * * * *